(12) United States Patent
Sato

(10) Patent No.: US 9,281,790 B2
(45) Date of Patent: Mar. 8, 2016

(54) AMPLIFIER CIRCUIT

(71) Applicant: FUJITSU LIMITED, Kawasaki-shi, Kanagawa (JP)

(72) Inventor: Masaru Sato, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/599,639

(22) Filed: Jan. 19, 2015

(65) Prior Publication Data

US 2015/0236657 A1 Aug. 20, 2015

(30) Foreign Application Priority Data

Feb. 20, 2014 (JP) ................. 2014-030874

(51) Int. Cl.
*H03F 3/04* (2006.01)
*H03F 3/60* (2006.01)
*H03F 1/34* (2006.01)
*H03F 1/56* (2006.01)

(52) U.S. Cl.
CPC ............... *H03F 3/601* (2013.01); *H03F 1/342* (2013.01); *H03F 1/56* (2013.01); *H03F 2200/405* (2013.01); *H03F 2200/72* (2013.01)

(58) Field of Classification Search
USPC ................................. 330/107, 302, 310, 311
IPC ......................................................... H03F 3/04
See application file for complete search history.

(56) References Cited

U.S. PATENT DOCUMENTS

| 3,452,217 A * | 6/1969 | Kennedy ................. G06G 7/06 327/362 |
| 4,567,363 A * | 1/1986 | Goodnough ............ H03F 3/082 250/214 A |
| 6,621,341 B1 * | 9/2003 | Shifrin ................. H03F 3/3435 330/110 |
| 2003/0222719 A1 | 12/2003 | Yang et al. |
| 2005/0077930 A1 * | 4/2005 | Masuda ................ H03B 19/00 327/113 |
| 2009/0033440 A1 * | 2/2009 | Masuda ................ H03H 11/42 333/215 |

FOREIGN PATENT DOCUMENTS

| JP | 09-018247 | 1/1997 |
| JP | 2004-007703 | 1/2004 |
| WO | 2007/099622 | 9/2007 |

* cited by examiner

*Primary Examiner* — Patricia T Nguyen
(74) *Attorney, Agent, or Firm* — Fujitsu Patent Center

(57) ABSTRACT

An amplifier circuit has a plurality of amplifiers configured to be connected in series, and each of the plurality of amplifiers has an amplifying element configured to non-inverting amplify a signal and a phase adjustment element configured to be connected to an output terminal of the amplifying element and to adjust a phase of the signal, wherein the amplifying element is subjected to negative feedback, and wherein a stability coefficient of a circuit in which the amplifying elements of the number the same as the number of the plurality of amplifiers are connected in series is less than 1.

10 Claims, 7 Drawing Sheets

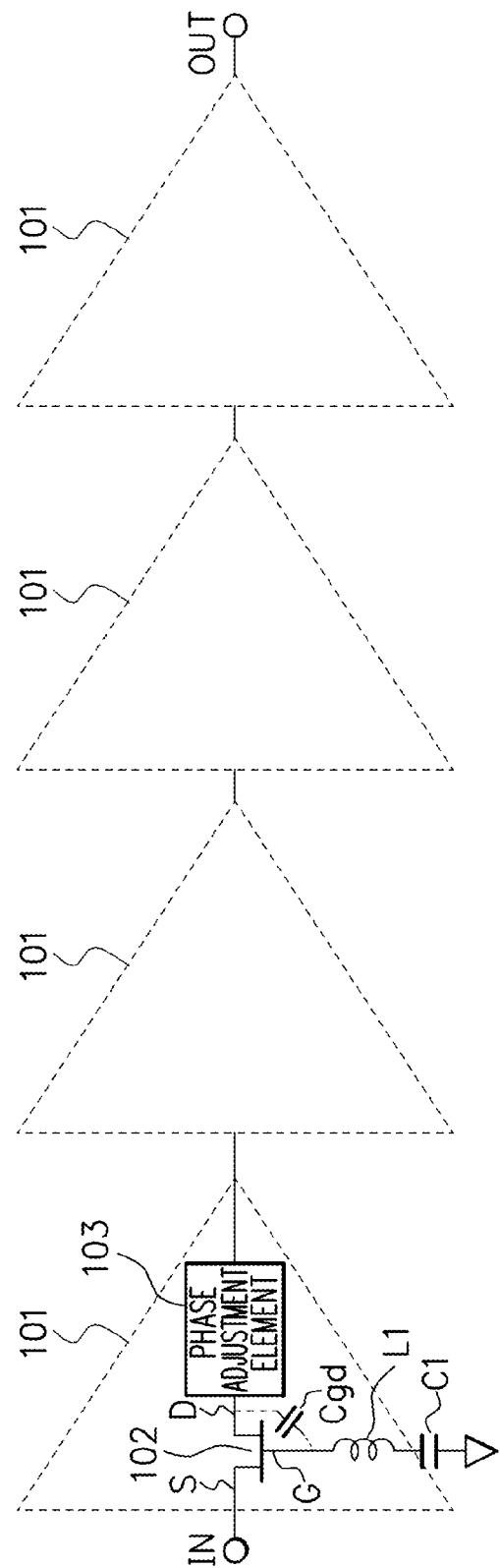

F I G. 4A
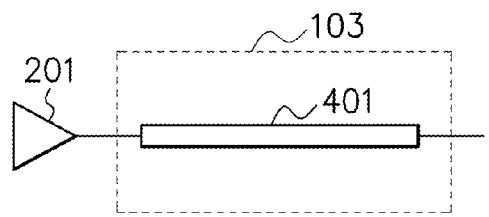
F I G. 4B
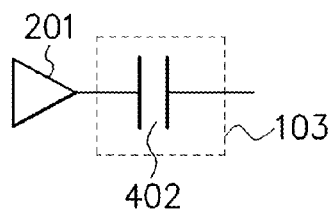
F I G. 4C
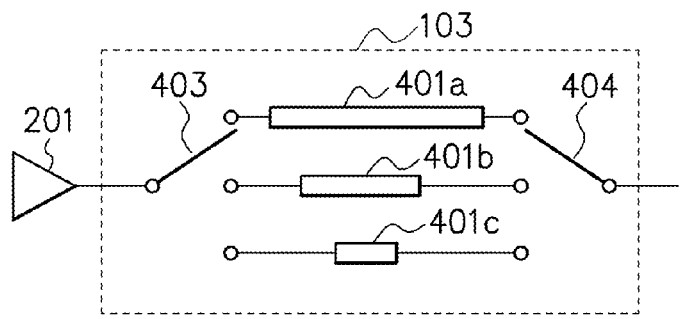
F I G. 4D
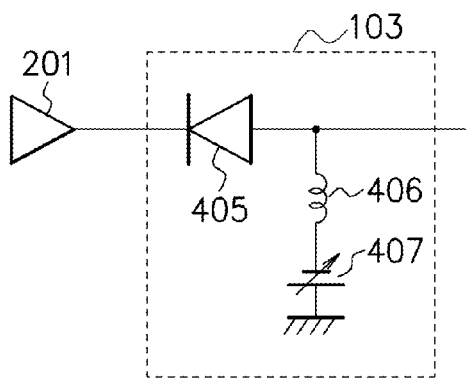

F I G. 5A
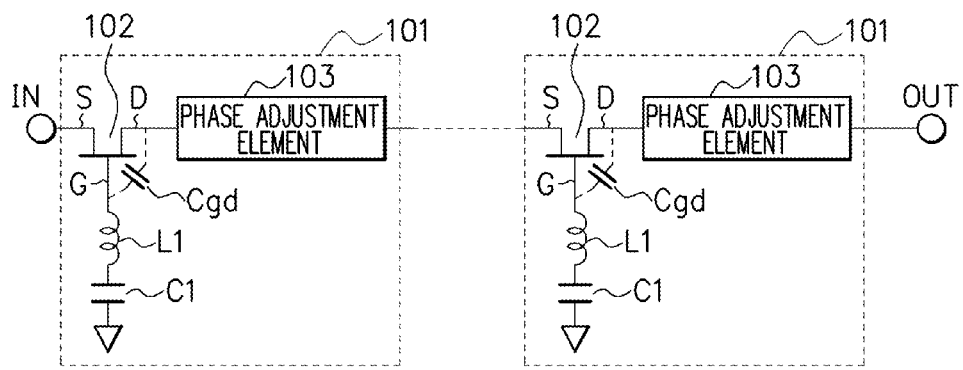
F I G. 5B
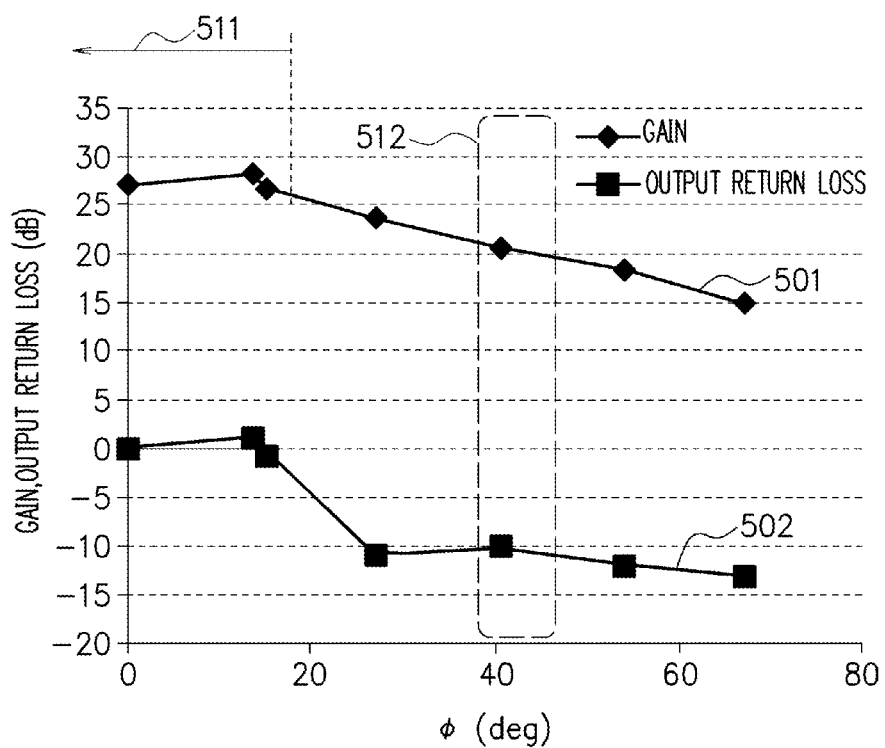

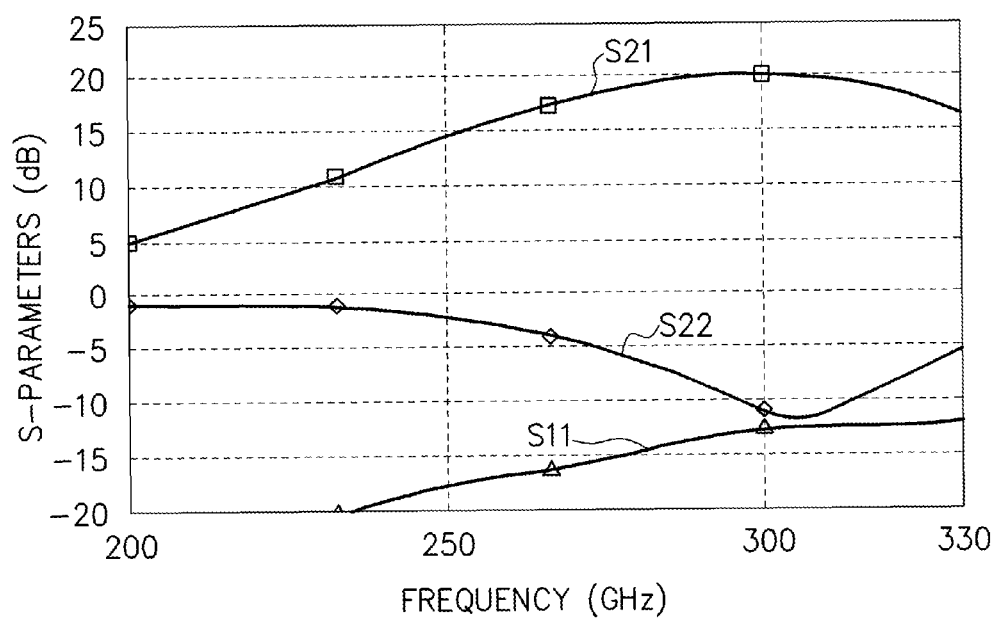
F I G. 6

FIG. 7A
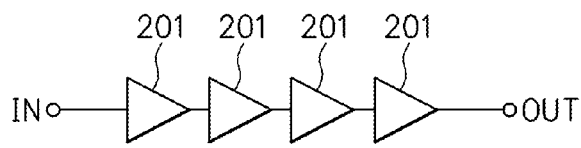
FIG. 7B
| UNIT AMPLIFYING ELEMENT | | QUADRUPLE AMPLIFYING ELEMENT | | |
|---|---|---|---|---|
| S22 (dB) | OUTPUT REFLECTION COEFFICIENT Γ | S21 (dB) | S22 (dB) | K VALUE |
| 0.84 | 1.21338885 | 7.8 | 0.69 | −54 |
| −0.12 | 0.972747224 | 7.9 | 0.87 | −11 |
| −1.1 | 0.776247117 | 6.1 | 0.1 | −0.7 |
| −1.5 | 0.707945784 | 4.6 | −0.4 | 1.8 |
| −2.1 | 0.616595002 | 2 | −1.3 | 5.4 |
| −3 | 0.501187234 | −2.3 | −3 | 11 |
FIG. 7C
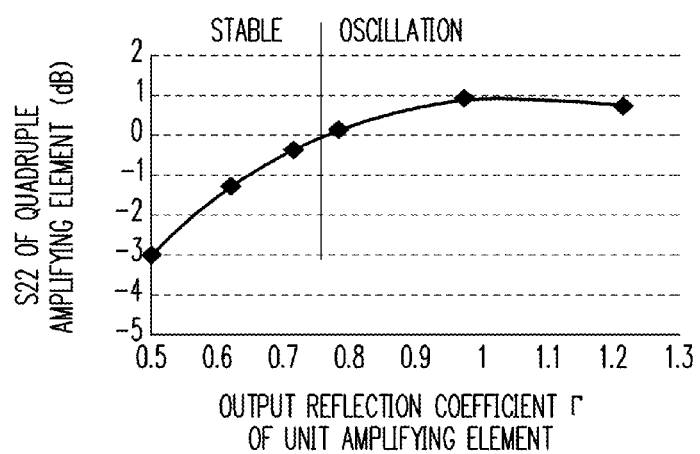

AMPLIFIER CIRCUIT

CROSS-REFERENCE TO RELATED APPLICATION

This application is based upon and claims the benefit of priority of the prior Japanese Patent Application No. 2014-030874, filed on Feb. 20, 2014, the entire contents of which are incorporated herein by reference.

FIELD

The embodiment discussed herein is directed to an amplifier circuit.

BACKGROUND

There is known an amplifier circuit that has a first transistor which is connected to an input terminal and whose gate is grounded in an AC manner and a second transistor which is connected to the first transistor in series and whose gate is grounded in an AC manner (for example, see Patent Document 1). A first resonance circuit includes an inductor and a capacitance connected to the gate of the second transistor in series. The inductor and/or capacitance of the first resonance circuit is (are) variable.

Further, a bidirectional amplifier which amplifies an RF signal is known (for example, see Patent Document 2). A first input port is electrically coupled to an end of an RF transmission line. A second input port is electrically coupled to an opposite end of the RF transmission line. At least one variable matching network is electrically coupled to the transmission line between the first input port and the second input port. At least one amplifier device is electrically coupled to the RF transmission line between the first input port and the second input port. At least one amplifier device amplifies an RF signal applied to either one of the first input port or the second input port. The variable matching network carries out different impedance matching to the RF signal applied to the first input port and the RF signal applied to the second input port.

Further, there is known a high-frequency amplification device which has a signal distribution means which distributes a high frequency, a phase adjustment means which adjusts a phase of one of modulated waves having been distributed by the signal distribution means, and an amplification means whose input signal is the phase-adjusted modulated wave (for example, see Patent Document 3). An envelope signal detection means detects an envelope signal of the other modulated wave having been distributed by the signal distribution means. A control voltage generation means has an analog-digital conversion means, a digital-analog conversion means, and a storage means. The analog-digital conversion means converts an envelope signal detected by the envelope signal detection means into a digital signal. The digital-analog conversion means converts a digital signal into an analogy voltage. The storage means connects the analog-digital conversion means and the digital-analog conversion means. An amplification means is constituted with an amplifier circuit made of a cascade amplifying element in which a drain terminal of a grounded-source FET and a source electrode of a grounded-gate FET are directly connected with each other. By giving an output of the control voltage generation means to a gate of the grounded-gate FET to change bias distribution of the grounded-source FET and the grounded-gate FET, an output level of the amplifier circuit is controlled in accordance with an envelope signal.

[Patent Document 1] International Publication Pamphlet No. 2007/099622

[Patent Document 2] Japanese Laid-open Patent Publication No. 2004-7703

[Patent Document 3] Japanese Laid-open Patent Publication No. 9-18247

In a case where a plurality of transistors whose gates are grounded in an AC manner is connected in series, a high frequency input signal brings about positive feedback and oscillation since the grounded-gate transistor is a non-inverting amplifying element, and there is a problem that amplifying operation becomes unstable. Further, when the amplifying operation is intended to be stabilized by using resistance, a gain of amplification is reduced. It is difficult to attain both stabilization and a high gain in amplification.

SUMMARY

An amplifier circuit has a plurality of amplifiers configured to be connected in series, and each of the plurality of amplifiers has an amplifying element configured to non-inverting amplify a signal and a phase adjustment element configured to be connected to an output terminal of the amplifying element and to adjust a phase of the signal, wherein the amplifying element is subjected to negative feedback, and wherein a stability coefficient of a circuit in which the amplifying elements of the number the same as the number of the plurality of amplifiers are connected in series is less than 1.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1 is a diagram depicting a configuration example of an amplifier circuit according to the present embodiment;

FIG. 4A to FIG. 4D are diagrams depicting configuration examples of a phase adjustment element;

FIG. 5A is a diagram depicting a configuration example of the amplifier circuit of the present embodiment and FIG. 5B is a graph depicting a simulation result of a gain and an output return loss of the quadruple amplifier circuit of FIG. 5A;

FIG. 6 is a graph depicting a simulation result of frequency characteristics of the S parameters of the quadruple amplifier circuit of FIG. 5A; and FIG. 7A to FIG. 7C are diagrams for explaining characteristics of a unit amplifying element and a quadruple amplifying element.

DESCRIPTION OF EMBODIMENTS

FIG. 1 is a diagram depicting a configuration example of an amplifier circuit according to the present embodiment. The amplifier circuit has a plurality of (for example, four) amplifiers 101 connected in series between an input terminal IN and an output terminal OUT. Each of the plural amplifiers 101 has an re-channel field effect transistor 102, a parasitic inductor L1, a capacitance C1, a parasitic capacitance Cgd, and a phase adjustment element 103. The field effect transistor 102 has a source terminal S, a gate terminal G, and a drain terminal D. The source terminal S of the field effect transistor 102 is connected to an input terminal of the amplifier 101. A serial connection circuit of the parasitic inductor L1 and the capacitance C1 is connected between the gate terminal G of the field effect transistor 102 and a reference potential node (ground potential node). The amplifier 101 is operated at a frequency having negative resistance by the parasite inductor L1. The parasitic capacitance Cgd is connected between the gate terminal G and the drain terminal D of the field effect transistor 102. The field effect transistor 102 is a grounded-gate field effect transistor whose gate terminal G is grounded in an AC manner and whose source terminal S and drain terminal D are an input terminal and an output terminal, respectively, and non-inverting amplifies a signal. The phase adjustment element 103 is connected between the drain terminal D of the field effect transistor 102 and an output terminal of the amplifier 101, and adjusts a phase of the signal. The input terminal IN is connected to the input terminal of the amplifier 101 of a first stage. The output terminal OUT is connected to the output terminal of the amplifier 101 of a final stage. The amplifier circuit amplifies an AC signal inputted to the input terminal IN and outputs from the output terminal OUT.

Figure 2A:
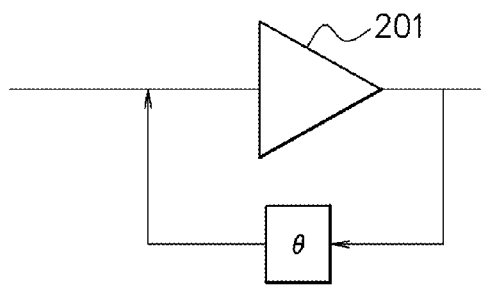
FIG. 2A is a schematic diagram depicting an amplifying element.

FIG. 2A is a schematic diagram depicting an amplifier 101 which does not have the phase adjustment element 103 in FIG. 1. An amplifying element 201 corresponds to the field effect transistor 102, the parasitic inductor L1, the capacitance C1, and the parasitic capacitance Cgd of FIG. 1. In the amplifying element 201, an input terminal is the source terminal S of the field effect transistor 102, and an output terminal is the drain terminal D of the field effect transistor 102. An input signal of the amplifying element 201 is a voltage between the source terminal S and a gate terminal G of the field effect transistor 102. An output signal of the drain terminal D of the field effect transistor 102 is reflected via an input terminal of the amplifier 101 of the next stage. The reflected signal is inputted from the drain terminal D to the gate terminal G of the field effect transistor 102 via the parasite capacitance Cgd. This means that the reflected signal is fed back from the output terminal to the input terminal of the amplifying element 201 by a phase shift amount θ. Here, the grounded-gate field effect transistor 102 is a non-inverting amplifying transistor in which a phase of an output signal is the same as a phase of an input signal. Thus, when the input signal has a high frequency, the phase shift amount θ of feedback is 0 (zero) degree and phases of the input signal of the amplifying element 201 and a feedback signal become the same, whereby positive feedback is applied to the amplifying element 201, oscillation occurs, and operation becomes unstable.

Figure 2B:
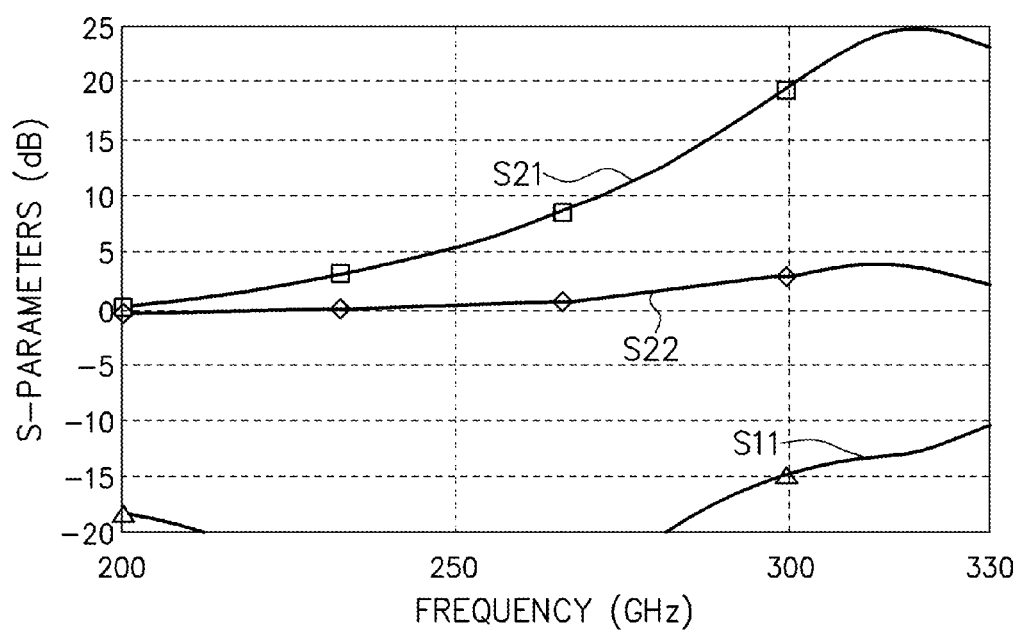
FIG. 2B is a graph depicting a simulation result of S parameters of a quadruple amplifying element.

FIG. 2B is a graph depicting a simulation result of S parameters of an amplifier circuit in which four amplifiers 101 without the phase adjustment element 103 are connected in series in FIG. 1. A horizontal axis indicates a frequency of an input signal of the amplifier circuit. S parameters S11, S22, S21, S12 are represented by the following formulas. Note that in FIG. 2B, the S parameter S12 is omitted.

$S11 = 10 \times \log_{10}\{(\text{power of reflected wave of input terminal})/(\text{power of incident wave of input terminal})\}$ [dB]

$S22 = 10 \times \log_{10}\{(\text{power of reflected wave of output terminal})/(\text{power of incident wave of output terminal})\}$ [dB]

$S21 = 10 \times \log_{10}\{(\text{power of output wave of output terminal})/(\text{power of incident wave of output terminal})\}$ [dB]

$S12 = 10 \times \log_{10}\{(\text{power of output wave of input terminal})/(\text{power of incident wave of output terminal})\}$ [dB]

In particular, around a frequency of 300 GHz of an input signal, the S parameter S22 becomes larger than 0 dB and the amplifier circuit oscillates, operation becoming unstable. It is difficult to use this amplifier circuit in a frequency band around 300 GHz. Here, a method is conceived in which a reflected wave is made small by using an impedance matching circuit, to prevent oscillation. However, in the present embodiment, the reflected wave is not made small but the reflected wave is aggressively used to prevent oscillation. Thus, an amplifying element 201 having a large S parameter S22 is used. Hereinafter, a characteristic of the amplifying element 201 used in the present embodiment will be described with reference to FIG. 7A to FIG. 7C.

FIG. 7A is a diagram depicting a serial connection circuit (quadruple amplifying element) of four amplifying elements 201. FIG. 7B is a table depicting a simulation result of an S parameter S22 [dB] of one amplifying element 201 (unit amplifying element), an output reflection coefficient Γ of the one amplifying element 201 (unit amplifying element), an S parameter S21 [dB] of a serial connection circuit (quadruple amplifying element) of four amplifying elements 201, an S parameter S22 [dB] of the serial connection circuit (quadruple amplifying element) of the four amplifying elements 201, and a stability factor K of the serial connection circuit (quadruple amplifying element) of the four amplifying elements 201.

The output reflection coefficient Γ is represented by the following formula, similarly to the S parameter S22.

$\Gamma = (\text{power of reflected wave of output terminal})/(\text{power of incident wave of output terminal})$ The S parameter S21 is a gain. The stability factor K is represented by the following formula.

$K = (1 + |D|^2 - |S11|^2 - |S22|^2)/(2 \times |S12| \times |S21|)$ $D = S11 \times S22 - S12 \times S21$ When the stability factor K is less than 1, the amplifier circuit becomes unstable and oscillates. Therefore, in the present embodiment, a stability factor K of a circuit in which the amplifying elements 201 of the number (for example, four) the same as the number of the plural (for example, four) amplifiers 101 constituting the amplifier circuit are connected in series is preferable to be less than 1.

Further, when the stability factor K of the quadruple amplifying element is less than 1, the S parameter S22 of the quadruple amplifying element becomes larger than 0 dB, and oscillation occurs. Therefore, in the present embodiment, an S parameter S22 of the circuit in which the amplifying elements 201 of the number (for example, four) the same as the number of the plural (for example, four) amplifiers 101 constituting the amplifier circuit are connected in series is preferable to be larger than 0 dB.

Further, as depicted in FIG. 7B and FIG. 7C, when the S parameter S22 of the quadruple amplifying element is larger than 0 dB, an output reflection coefficient Γ of one amplifying element 201 (unit amplifying element) becomes larger than 0.75 and oscillation occurs. Therefore, the output reflection coefficient Γ of the amplifying element 201 is preferable to be larger than 0.75.

Figure 3:
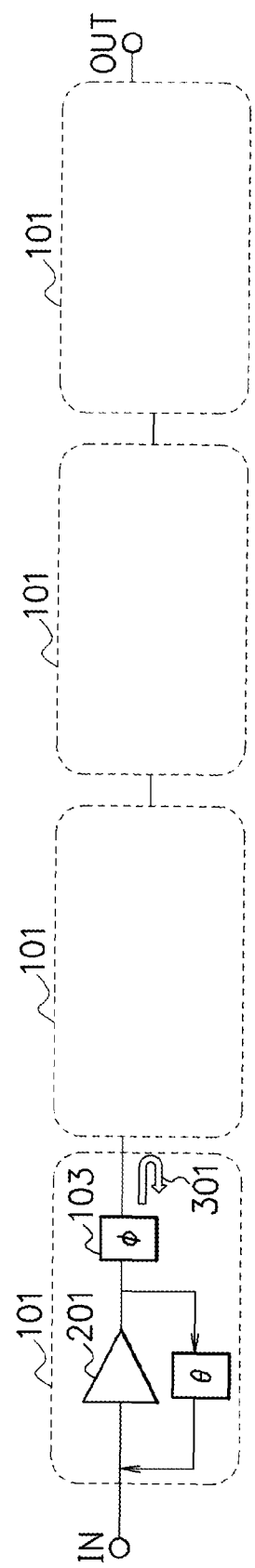
FIG. 3 is a schematic diagram of the amplifier circuit of FIG. 1.

FIG. 3 is a schematic diagram of the amplifier circuit of FIG. 1. The amplifier circuit has the plural (for example, four) amplifiers 101 connected in series between the input terminal IN and the output terminal OUT. Each of the four amplifiers 101 has the amplifying element 201 and the phase adjustment element 103. The amplifying element 201 has the field effect transistor 102, the parasitic inductor L1, the capacitance C1, and the parasitic capacitance Cgd of FIG. 1, and non-inverting amplifies a signal. In the amplifying element 201, the input terminal is the source terminal S of the field effect transistor 102 and the output terminal is the drain terminal D of the field effect transistor 102. The phase adjustment element 103 is connected to the output terminal of the amplifying element 201 and shifts a phase of a signal by a phase shift amount φ.

The amplifying element 201 non-inverting amplifies a signal. In other words, a phase of an input signal and a phase of an output signal of the amplifying element 201 are the same. When the output signal of the output terminal (the drain terminal D of the field effect transistor 102) passes through the phase adjustment element 103, the phase thereof shifts by the phase shift amount φ, and thereafter, the output signal of the output terminal of the amplifying element 201 is reflected via the input terminal of the amplifier 101 of the next stage. When the reflected signal 301 passes through the phase adjustment element 103, a phase thereof shifts by the phase shift amount φ, and thereafter, the reflected signal 301 is inputted from the drain terminal D to the gate terminal G of the field effect transistor 102 via the parasitic capacitance Cgd. This means, similarly to in FIG. 2A, that the reflected signal 301 is fed back from the output terminal to the input terminal of the amplifying element 201 by the phase shift amount θ. As described above, the output signal of the amplifying element 201 is phase-shifted by the phase shift amount φ by means of the phase adjustment element 103, the reflected signal 301 is phase-shifted by the phase shift amount φ by means of the phase adjustment element 103, and a feedback signal is phase-shifted by the phase shift amount θ. Therefore, with regard to the feedback signal of the amplifying element 201, the phase shift amount is 2×φ+θ for the input signal of the amplifying element 201. When the phase shift amount 2×φ+θ is 180 degrees, negative feedback is applied to the amplifying element 201, so that oscillation is prevented and operation can be stabilized. In the present embodiment, as described above, by using the amplifying element 201 in which the stability factor K of the quadruple amplifying element of FIG. 7A is less than 1, the reflected signal 301 is made comparatively larger, and by aggressively using the reflected signal 301, negative feedback is applied to the amplifying element 201. As a result that the phase adjustment element 103 is provided, the phase shift amount 2×φ+θ is made to be 180 degrees to apply negative feedback to the amplifying element 201, preventing oscillation and stabilizing operation.

For example, in a frequency band of 300 GHz of an input signal, the phase shift amount θ is 90 degrees. In this case, by making the phase shift amount φ of the phase adjustment element 103 be 45°, the phase shift amount 2×φ+θ becomes 180 degrees, so that oscillation is prevented and operation can be stabilized.

FIG. 4A to FIG. 4D are diagrams depicting configuration examples of the phase adjustment element 103. In FIG. 4A, the phase adjustment element 103 has a line 401 for delaying a signal, and can adjust a phase shift amount φ in correspondence with a length of the line 401. In FIG. 4B, the phase adjustment element 103 has a capacitance 402.

Since the phase shift amount θ of feedback changes depending on a frequency band of an input signal, it is necessary to also change a phase shift amount φ of the phase adjustment element 103. FIG. 4C and FIG. 4D depict configuration examples of the phase adjustment element 103 in which phase shift amounts φ are variable. In FIG. 4C, the phase adjustment element 103 has a plurality of lines 401a to 401c whose phase shift amounts φ for delaying signals are different, and switch elements 403, 404. The switch element 403 connects the output terminal of the amplifying element 201 to any one of the plural lines 401a to 401c. The switch element 404 connects the output terminal of the amplifier 101 to any one of the plural lines 401a to 401c in correspondence with the switch element 403.

In FIG. 4D, the phase adjustment element 103 has a varactor diode 405, a choke coil 406, and a DC power supply 407. A cathode of the varactor diode 405 is connected to the output terminal of the amplifying element 201, and an anode thereof is connected to the output terminal of the amplifier 101. The choke coil 406 is connected between the anode of the varactor diode 405 and a negative pole terminal of the DC power supply 407. A positive pole terminal of the DC power supply 407 is connected to the reference potential node (ground potential node). By changing a direct-current voltage of the DC power supply 407, a capacitance of the varactor diode 405 changes, so that the phase shift amount φ can be changed.

Note that polarities of the varactor diode 405 and the DC power supply 407 can be reversed. In such a case, the anode of the varactor diode 405 is connected to the output terminal of the amplifying element 201 and the cathode thereof is connected to the output terminal of the amplifier 101. With regard to the DC power supply 407, the positive pole terminal is connected to the cathode of the varactor diode 405 via the choke coil 406, and the negative pole terminal is connected to the reference potential node.

FIG. 5A is a diagram depicting a configuration example of the amplifier circuit of the present embodiment. In the amplifier circuit, similarly to in FIG. 1, four amplifiers 101 are connected in series. Each amplifier 101 has a field effect transistor 102, a parasitic inductor L1, a capacitance C1, a parasitic capacitance Cgd, and a phase adjustment element 103.

FIG. 5B is a graph depicting a simulation result of a gain 501 and an output return loss 502 of the quadruple amplifier circuit of FIG. 5A, and indicates a case where an input signal is in a frequency band of 300 GHz. A horizontal axis indicates a phase shift amount φ of the phase adjustment element 103. In this example, a phase shift amount θ of feedback is 90 degrees. In a range 511 where the phase shift amount φ of the phase adjustment element 103 is 20 degrees or less, the gain 501 is high but the output return loss 502 is large, leading to instability. In contrast, in a range where the phase shift amount φ of the phase adjustment element 103 is 30 degrees or more to 65 degrees or less, the output return loss 501 is −10 dB or less, leading to stability. In particular, in an optimum range 512 where the phase shift amount φ of the phase adjustment element 103 is 40 degrees or more to 45 degrees or less, the gain 501 is about 20 dB and the output return loss 502 is −10 dB or less, leading to stability and a high gain. In order to make a phase difference between a feedback signal and the input signal be 180 degrees, the phase shift amount φ is 45 degrees, but the phase shift amount φ is not limited to 45 degrees and the range 512 centering on 45 degrees is suitable.

FIG. 6 is a graph depicting a simulation result of frequency characteristics of S parameters S21, S22, and S11 of the quadruple amplifier circuit of FIG. 5A. In a frequency of 300 GHz of a signal, the S parameter S21 indicating a gain is large while the S parameter S22 indicating an output reflection coefficient is small, exhibiting a high gain and a low output return loss. Since the present embodiment carries out stabilization without using resistance, it is possible to maintain the high return. In the present embodiment (FIG. 6), around 300 GHz, the S parameter S21 indicating a gain is equivalent and the S parameter S22 indicating an output reflection coefficient is smaller, in relation to FIG. 2B. In FIG. 6, since the S parameter S22 is smaller than 0 dB, it is possible to prevent oscillation and to stabilize operation.

Note that the amplifying element 201 of FIG. 3 is described by the example of a case where the amplifying element 201 has the grounded-gate field effect transistor 102 but the amplifying element 201 is not limited thereto, and it suffices that the amplifying element 201 is an amplifying element which non-inverting amplifies a signal. For example, the amplifying element 201 can have a grounded-base bipolar transistor instead of the grounded-gate field effect transistor 102.

As described above, according to the present embodiment, as a result that the phase adjustment element 103 adjusts the phase of the reflected signal 301 to the output signal of the amplifying element 201, negative feedback is applied to the amplifying element 201, enabling prevention of oscillation. Thereby, it is possible to heighten a gain of amplification and to stabilize operation.

A communication system using a high frequency, such as a wireless local area network (LAN) and a radar, is increasingly demanded in recent years. In order to realize such a communication system, an amplification circuit is used in a transmission unit or a reception unit. Such an amplifier circuit is required for characteristics of a high gain, a broad operation frequency range (frequency band), and so on. It is difficult to realize an amplifier circuit with a high gain in a high frequency of 100 GHz or more. The amplifier circuit of the present embodiment is suitable for being used in a high frequency circuit of a GHz band of the wireless LAN, the radar, or the like.

Note that the above embodiment presents only a concrete example in carrying out the present embodiment and the technical scope of the present invention should not be construed in a limited manner by the above. In other words, the present embodiment can be carried out in various forms without departing from its technical idea or its main characteristics.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An amplifier circuit comprising
    a plurality of amplifiers configured to be connected in series, each of the plurality of amplifiers comprising:
        an amplifying element configured to non-inverting amplify a signal; and
        a phase adjustment element configured to be connected to an output terminal of the amplifying element and to adjust a phase of the signal,
    wherein the amplifying element is subjected to negative feedback, and
    wherein a stability coefficient of a circuit in which the amplifying elements of the number the same as the number of the plurality of amplifiers are connected in series is less than 1.

2. The amplifier circuit according to claim 1,
    wherein the amplifying element has a grounded-gate filed effect transistor or a grounded-base bipolar transistor.

3. The amplifier circuit according to claim 1,
    wherein the amplifying element has a field effect transistor whose gate terminal is grounded in an AC manner and whose source terminal and drain terminal are an input terminal and an output terminal respectively.

4. The amplifier circuit according to claim 3,
    wherein the amplifying element has a parasitic capacitance connected between the gate terminal and the drain terminal of the field effect transistor.

5. The amplifier circuit according to claim 4,
    wherein an output signal of the drain terminal of the field effect transistor is reflected after passing through the phase adjustment element, and
    wherein the reflected signal is inputted to the gate terminal of the field effect transistor via the phase adjustment element and the parasitic capacitance.

6. The amplifier circuit according to claim 1,
    wherein the phase adjustment element has a line or a capacitance to delay a signal.

7. The amplifier circuit according to claim 1,
    wherein the phase adjustment element has a plurality of lines with different phase shift amounts to delay a signal, and a switch element which connects the output terminal of the amplifying element to any one of the plurality of lines.

8. The amplifier circuit according to claim 1,
    wherein the phase adjustment element has a varactor diode.

9. The amplifier circuit according to claim 1,
    wherein an S parameter S22 of the circuit in which the amplifying elements of the number the same as the number of the plurality of amplifiers are connected in series is larger than 0 dB.

10. The amplifier circuit according to claim 1,
    wherein an output reflection coefficient of the amplifying element is larger than 0.75.

* * * * *